US 8,527,676 B2

(12) United States Patent
Morrison et al.

(10) Patent No.: US 8,527,676 B2
(45) Date of Patent: *Sep. 3, 2013

(54) REDUCING LATENCY IN SERIALIZER-DESERIALIZER LINKS

(75) Inventors: Michael J. Morrison, Sunnyvale, CA (US); Jay B. Patel, Los Gatos, CA (US); Philip A. Ferolito, Sunnyvale, CA (US); Michael J. Miller, Saratoga, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/467,955

(22) Filed: May 9, 2012

(65) Prior Publication Data

US 2012/0221882 A1    Aug. 30, 2012

Related U.S. Application Data

(63) Continuation of application No. 12/697,223, filed on Jan. 30, 2010.

(51) Int. Cl.
*G06F 13/38* (2006.01)
*G06F 15/16* (2006.01)
*G06F 13/00* (2006.01)

(52) U.S. Cl.
USPC ...... 710/53; 710/52; 710/57; 711/5; 711/157; 709/234

(58) Field of Classification Search
None
See application file for complete search history.

(56) References Cited

U.S. PATENT DOCUMENTS

| 5,058,132 | A |   | 10/1991 | Li |   |
|---|---|---|---|---|---|
| 5,268,937 | A |   | 12/1993 | Marbot |   |
| 5,448,715 | A | * | 9/1995 | Lelm et al. | 713/600 |
| 5,583,894 | A |   | 12/1996 | Linsley |   |
| 5,668,830 | A |   | 9/1997 | Georgiou et al. |   |
| 6,449,681 | B1 |   | 9/2002 | Gama et al. |   |
| 6,823,407 | B2 | * | 11/2004 | Porter et al. | 710/60 |
| 6,970,115 | B1 |   | 11/2005 | Sardi et al. |   |
| 7,013,359 | B1 | * | 3/2006 | Li | 710/305 |
| 7,181,485 | B1 | * | 2/2007 | Lau et al. | 718/100 |
| 7,212,423 | B2 |   | 5/2007 | Vogt |   |
| 7,296,124 | B1 | * | 11/2007 | Falik | 711/157 |
| 7,424,566 | B2 | * | 9/2008 | Manula et al. | 710/310 |
| 7,433,441 | B2 |   | 10/2008 | Jenkins et al. |   |
| 7,500,131 | B2 |   | 3/2009 | Panikkar et al. |   |
| 7,684,531 | B2 | * | 3/2010 | Masui et al. | 375/355 |
| 7,913,104 | B1 |   | 3/2011 | Cory et al. |   |
| 7,958,285 | B1 | * | 6/2011 | Chiu et al. | 710/52 |

(Continued)

FOREIGN PATENT DOCUMENTS

| JP | 01-223695 A | 9/1989 |
|---|---|---|
| KR | 10-0340298 B1 | 5/2002 |

OTHER PUBLICATIONS

Fujitsu introduces 65-Nanometer 10G SERDES from P Circuits; Mar. 31, 2008; http://www.fujitsu.com/us/news/pr/fma_20080331. html.

*Primary Examiner* — Elias Mamo
*Assistant Examiner* — Michael Sun
(74) *Attorney, Agent, or Firm* — Bever, Hoffman & Harms, LLP

(57) ABSTRACT

A system for increasing the efficiency of data transfer through a serializer-deserializer (SerDes) link, and for reducing data latency caused by differences between arrival times of the data on the SerDes link and the system clock with which the device operates.

20 Claims, 8 Drawing Sheets

(56) References Cited

U.S. PATENT DOCUMENTS

| | | | |
|---|---|---|---|
| 7,995,696 B1* | 8/2011 | Norrie | 375/372 |
| 2003/0079059 A1* | 4/2003 | Tsai | 710/1 |
| 2004/0028164 A1* | 2/2004 | Jiang et al. | 375/371 |
| 2004/0078665 A1* | 4/2004 | Rojas et al. | 714/23 |
| 2007/0130246 A1* | 6/2007 | Lau et al. | 709/200 |
| 2009/0019193 A1* | 1/2009 | Luk | 710/52 |
| 2010/0023709 A1* | 1/2010 | Feng et al. | 711/154 |
| 2010/0177841 A1* | 7/2010 | Yoon et al. | 375/295 |

\* cited by examiner

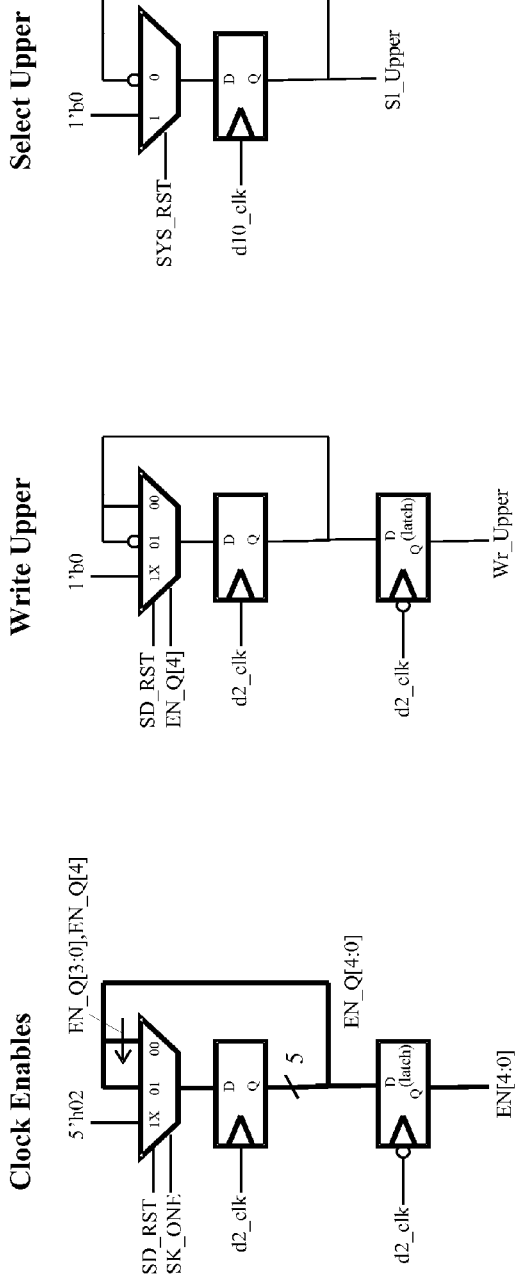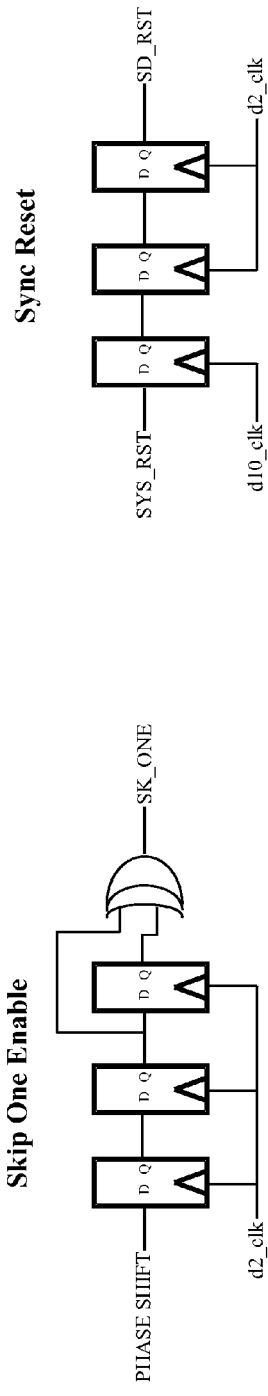
Fig. 4A Fig. 4B Fig. 4C Fig. 4D Fig. 4E

REDUCING LATENCY IN SERIALIZER-DESERIALIZER LINKS

RELATED APPLICATIONS

This application is a continuation of U.S. patent application Ser. No. 12/697,223, entitled "Reducing Latency In Sealizer-Deserializer Links" filed Jan. 30, 2010.

FIELD OF THE INVENTION

This invention relates to the design of integrated circuits. More particularly, this invention relates to a system for reducing data latency in data serializer/deserializer circuits.

BACKGROUND

As chip designers and manufacturers strive to increase the functionality of each piece of silicon, the need to communicate an ever increasing amount of data through a finite number of input/output pins continues to grow. In some systems, this has been addressed by incorporating high speed serial data links. These serial data links can pass a much greater amount of data through the same or a smaller number of physical wires or links than some other designs. An important element of the design of traditional serializer/deserializer (SerDes) links is to maintain the reliability of the data that traverses the link. Insuring link reliability has traditionally been more important than minimizing latency—or in other words increasing the speed—across a SerDes link.

The need to increase data throughput is pushing down into most digital systems to the point that all the components of a system must be able to handle greater amounts of data. Although data throughput continues to be a primary concern in the design of chip-to-chip SerDes links, the secondary issue of reducing data latency associated with the SerDes link is also becoming increasingly important What is needed, therefore, is circuitry and a clocking scheme that increases the efficiency and decreases the latency of SerDes links.

SUMMARY

The above and other needs are met by a method for reducing system latency in a data interface between a physical medium attachment and a physical coding sublayer, where the data interface comprises a data transmitter and a data receiver. The physical medium attachment is operable to deserialize incoming serial data from the physical coding sublayer, and the physical coding sublayer is operable to verify that the physical medium attachment has correctly aligned the incoming data. The method includes the steps of:
(a) generating a bit clock signal in a global macro,
(b) providing the bit clock signal to the data transmitter and the data receiver,
(c) generating a byte clock signal in the global macro, where the byte clock signal is a divided version of the bit clock signal,
(d) providing the byte clock signal to the physical coding sublayer, the data transmitter, and the data receiver,
(e) transferring data from the data receiver to the physical coding sublayer based on the byte clock signal, with no reliance upon the bit clock signal, and
(f) transferring data from the physical coding sublayer to the data transmitter based on the byte clock signal, with no reliance upon the bit clock signal.

Some embodiments provide a method for reducing data latency during deserialization of multilane serial data. This method includes the steps of:
(a) providing a double buffer having an upper buffer half and a lower buffer half,
(b) sequentially writing pairs of deserialized bits of the serial data to the upper buffer half at a first clock speed,
(c) when the upper buffer half is full, reading data from the upper buffer half into a physical coding sublayer at a second clock speed that is less than and dependent on the first clock speed,
(d) sequentially writing pairs of deserialized bits of the serial data to the lower buffer half at the first clock speed,
(e) when the lower buffer half is full, reading data from the lower buffer half at the second clock speed,
(f) aligning the data from the upper buffer half and the lower buffer half in the physical coding sublayer, and
(g) repeating steps (b) through (f) until all the serial data has been buffered and aligned.

Some embodiments provide a method for reducing data latency while processing multiple lanes of serial data in a serializer-deserializer circuit. The steps of this method include:
(a) determining a slowest lane of the multiple lanes of serial data, wherein the slowest lane is a lane having the latest arriving data,
(b) determining a time difference in unit intervals between a system clock and the slowest lane determined in step (a),
(c) shifting the timing of the system clock by m number of unit intervals to reduce the time difference determined in step (b), where m is greater than or equal to one, and
(d) repeating steps (a)-(c) until the time difference between the system clock and the slowest lane is within a desired number of unit intervals.

In some embodiments, a data interface reduces system latency between a physical medium attachment and a physical coding sublayer, where the physical medium attachment deserializes incoming serial data from the physical coding sublayer, and the physical coding sublayer verifies that the physical medium attachment correctly aligns the incoming data. The data interface of these embodiments includes a bit clock, a byte clock, a data transmitter, and a data receiver. The bit clock generates a bit clock signal and the byte clock generates a byte clock signal. The byte clock signal, which is a divided version of the bit clock signal, is provided to the physical coding sublayer. The data transmitter receives the bit clock signal and the byte clock signal, and receives data from the physical coding sublayer based on the byte clock signal, but with no reliance upon the bit clock signal. The data receiver also receives the bit clock signal and the byte clock signal, and transfers data to the physical coding sublayer based on the byte clock signal, but with no reliance upon the bit clock signal.

In some embodiments, a data interface reduces data latency during deserialization of multilane serial data. The data interface of these embodiments includes a first clock, a second clock, and a double buffer circuit. The first clock generates a first clock signal having a first clock speed. The second clock generates a second clock signal having a second clock speed that is less than and dependent on the first clock speed. The double buffer circuit includes an upper buffer half and a lower buffer half. Pairs of deserialized bits of the serial data are sequentially written into the upper buffer half at the first clock speed. When the upper buffer half is full, data is read from the upper buffer half into a physical coding sublayer at the second clock speed. Pairs of deserialized bits of the serial data are also sequentially written into the lower buffer half at the first clock speed, which data is read into the physical coding sublayer at the second clock speed when the lower buffer half is full. The physical coding sublayer aligns the data from the upper buffer half and the lower buffer half.

In another embodiment, a high-speed data interface is provided for reducing system latency. The data interface includes a data receiver comprising a sampling circuit and a locked-loop circuit, which may be a delay locked loop or a phase locked loop. The sampling circuit samples incoming data at an incoming data rate and generates an incoming serial data stream. The locked-loop circuit generates a common clock signal based on a reference clock signal so that the common clock signal substantially matches the incoming data rate. The data interface includes a deserializer circuit that receives the incoming serial data stream and the common clock signal, and that deserializes the incoming serial data stream to form deserialized bits of data based on the common clock signal. The data interface also includes a memory device that receives the deserialized bits of data from the deserializer circuit and outputs the deserialized bits of data based on the common clock signal. A serializer circuit receives the deserialized bits of data from the memory device and serializes the deserialized bits of data to form outgoing serial data, also based on the common clock signal.

BRIEF DESCRIPTION OF THE DRAWINGS

Further advantages of the invention are apparent by reference to the detailed description in conjunction with the figures, wherein elements are not to scale so as to more clearly show the details, wherein like reference numbers indicate like elements throughout the several views, and wherein:

FIGS. 4A-4E depict circuits for generating control signals for controlling a serializer-deserializer circuit.

DETAILED DESCRIPTION

Embodiments of the invention provide solutions to two specific problems associated with data latency into and out of a device that incorporates SerDes links as its input/output mechanism, which problems are:
(a) defining a mechanism that increases the efficiency of data transfer through a SerDes receiver, and
(b) defining a mechanism that reduces potential differences between arrival of data on SerDes links and the core (system) clock with which the receiving device operates.

Increasing Efficiency of Data Transfer

Figure 1:
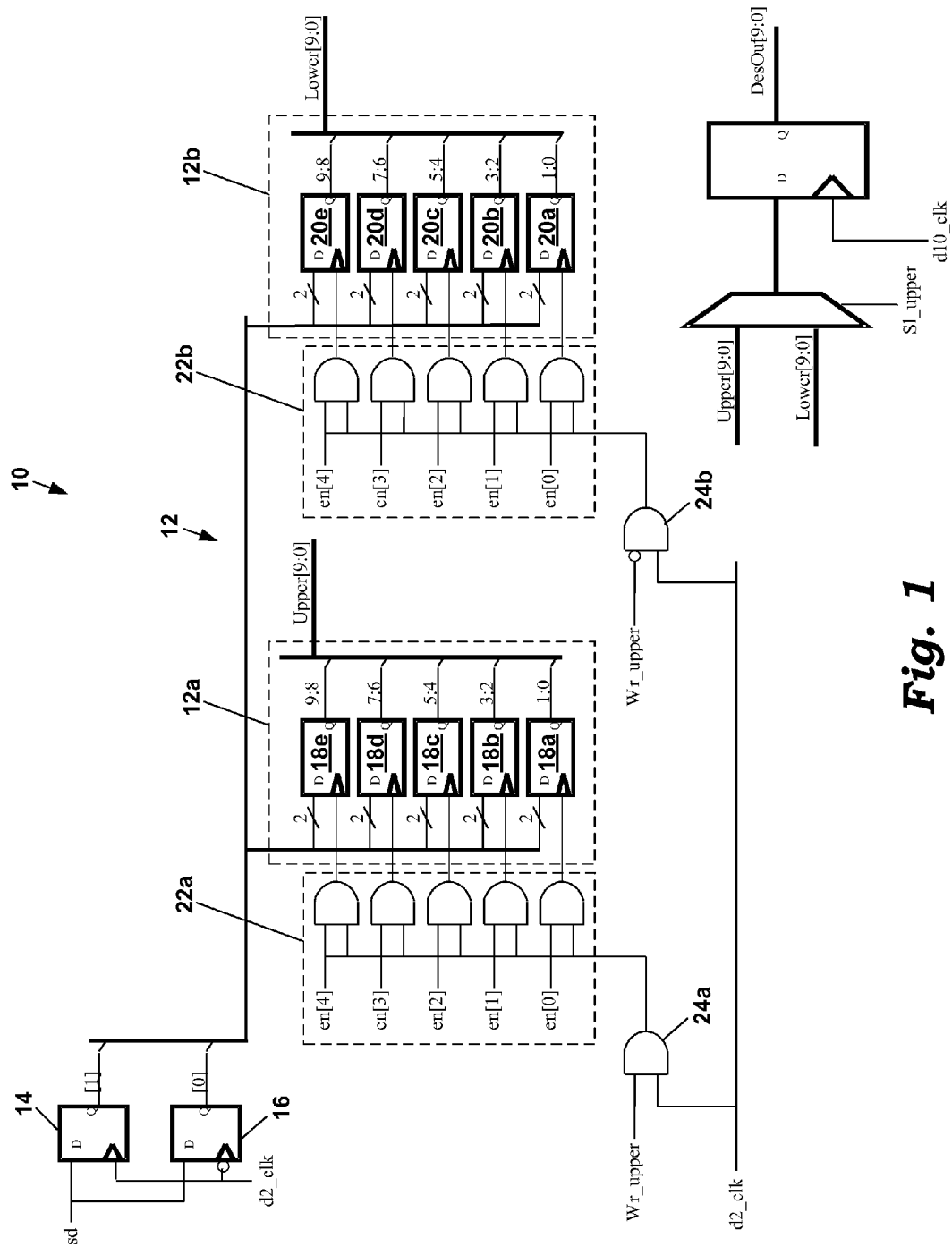
FIG. 1 depicts a schematic diagram of a deserializer circuit.

FIG. 1 depicts an embodiment of a 10-bit data deserializer circuit 10 having a double buffer 12 that includes an upper buffer half 12a and a lower buffer half 12b. The upper buffer half 12a includes shift registers 18a-18e and the lower buffer half includes shift registers 20a-20e. The circuit 10 corresponds to one lane of a multi-lane data structure.

In describing data interface circuits herein, clock speeds are represented by the nomenclature "dy_clk" where "y" is a divider value applied to a clock speed. For example, for a clock speed of ten gigahertz and y equals two, the nomenclature d2_clk represents a clock speed of five gigahertz (10/2 gigahertz).

With reference to FIG. 1, one bit of serial data enters register 14 on a positive clock edge at a first clock speed (d1_clk), such as ten gigahertz, and is output from the register 14 at a second clock speed (d2_clk), such as five gigahertz. A second bit of serial data enters register 16 on a trailing clock edge at the second clock speed. The two bits are first written into the upper buffer half 12a in ascending order. That is, the first pair of bits are written into shift register 18a, the second pair of bits are written into shift register 18b, and so on until each register in the upper buffer half 12a is full. Once the upper buffer half 12a is full, data is written in the same manner to the shift registers 20a-20e of the lower buffer half 12b.

Upon transition to the lower buffer half 12b, the data in the upper buffer half 12a is sent out to a slower frequency domain at a third clock speed (d10_clk) such as one gigahertz. Thus, the ten bits from the upper buffer half 12a are written out at one gigahertz and are transmitted on the line DesOut[9:0] to the physical coding sublayer (PCS) receive data path depicted in FIG. 5.

Figure 5:
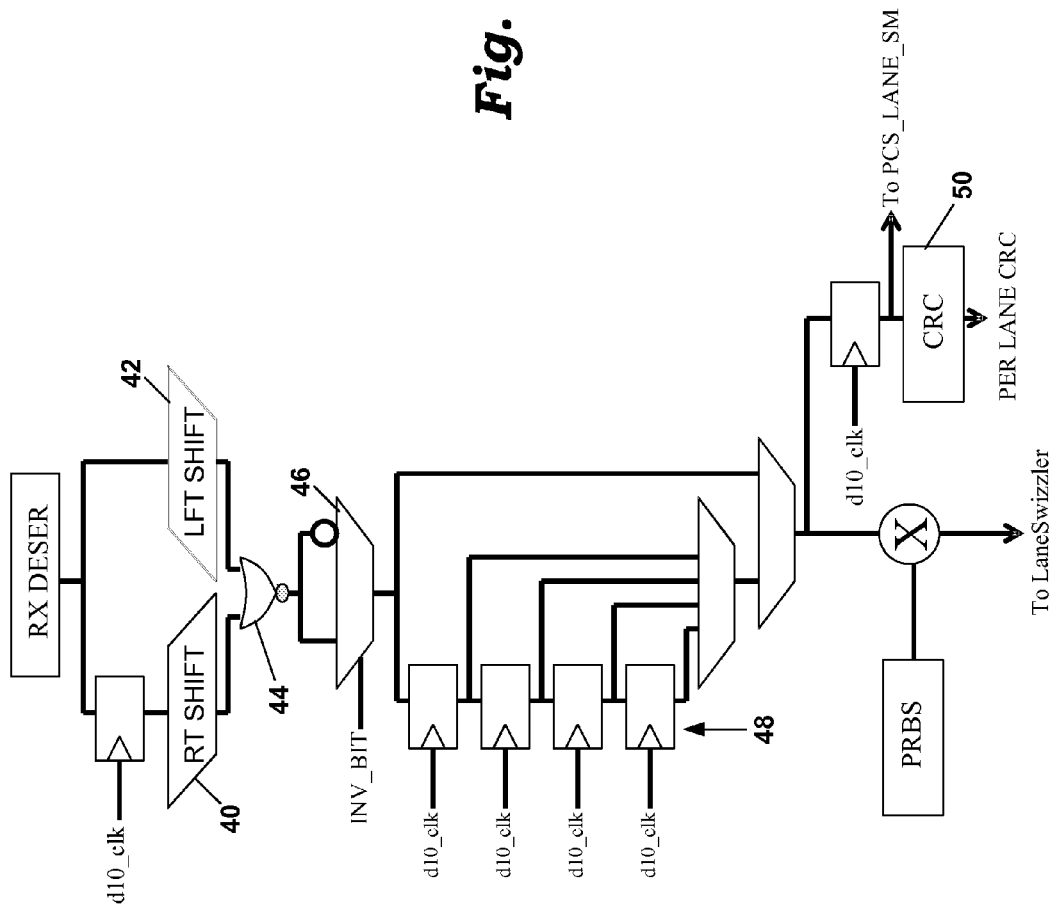
FIG. 5 depicts a circuit for aligning and deskewing data.

Incoming serial data is first registered on each edge of the SerDes clock at the second clock speed (d2_clk) to form two-bit deserialized data. These two bits are then written to one half of the double buffer 12 while the other is sent to the PCS receive data path (FIG. 5) for alignment. As described above, each half of the double buffer circuit 12 has ten registers (18a-18e and 20a-20e) which are organized in pairs to form ten bits of deserialized output data. Using the double buffer implementation of FIG. 1, the SerDes receiver of FIG. 5 is capable of aligning a desired number of bits (in this example ten bits). The ten bits of data may arrive at the receiving device at variable times across multiple lanes of a multilane system, where the variation in arrival times is caused by channel differences in the SerDes data lanes. By double-buffering the data, the data receiver may train at a link training time to grab the correct ten bits associated with an incoming word. The correct ten bits will most likely be a combination of the bits written out of the upper and lower buffer halves.

Safe transition between writing data at the second clock speed (d2_clk) and reading the two halves of the double buffer 12 at the third clock speed (d10_clk) is achieved during training For example, training or word synchronization may be performed only once at startup since the transmitting chip and receiving chip have the same reference clock and are not expected to experience any drift. There is no further need for training until the next startup or until a significant number of errors is observed on a link by a cyclical redundancy check. For example, if the cyclical redundancy checker 50 of FIG. 5 identifies a large number of bit errors, then it might be desirable to perform training.

For each buffer half, a five-bit one-shot shift register, shown in FIG. 4A controls gates 22a and 22b, and functions to enable the sequential selection of one of the five pairs of registers 18a-18e and 20a-20e for writing, and provides the transition signal between the two banks of registers. The transition from one bank of registers to the other is controlled by gates 24a and 24b that are clocked by the system clock d2_clk.

Figure 2:
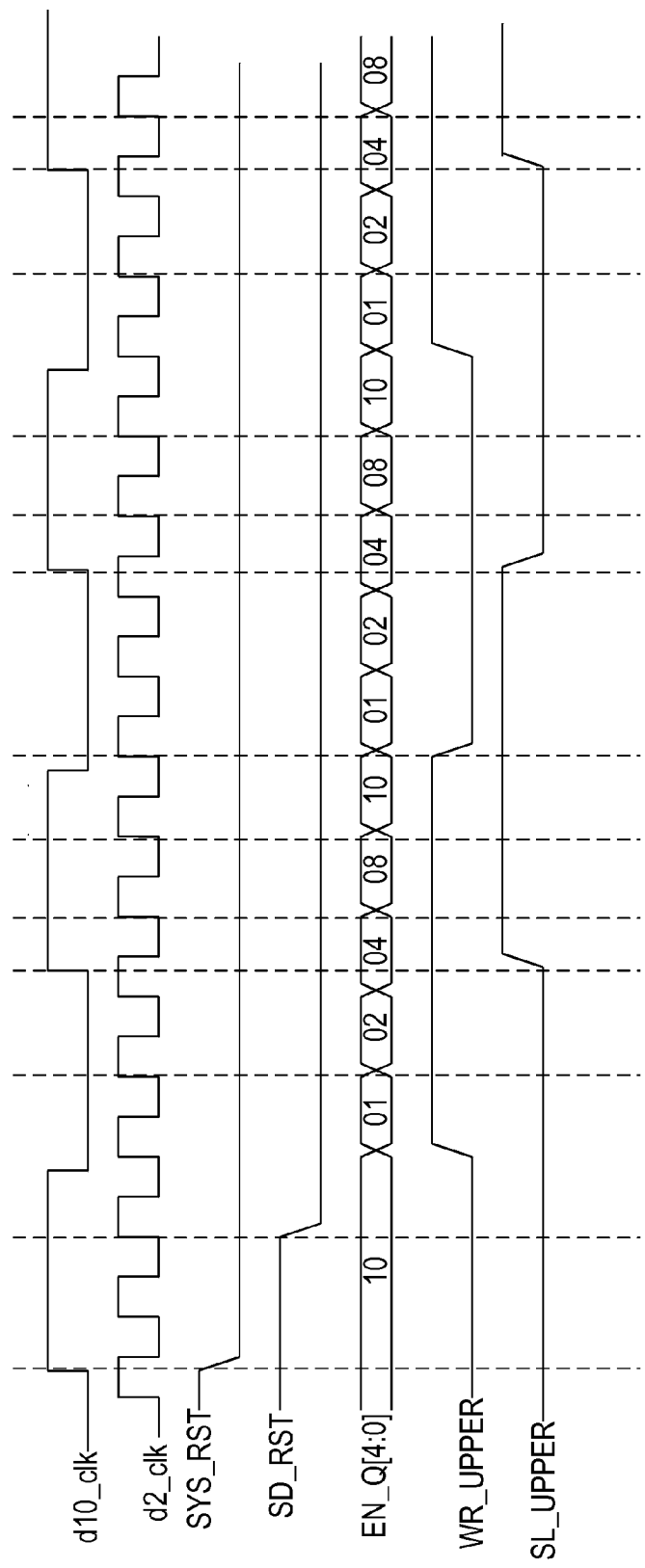
FIG. 2 depicts a timing diagram of a serializer-deserializer circuit.

The timing diagram of FIG. 2 depicts control signaling for data alignment according to one embodiment of the double-buffered scheme. For a SerDes data lane, a time unit interval (UI) is the time required to transfer one unit of information, such as one bit. With the initial values as shown in the FIG. 2, the transition from one bank of registers to the other occurs between 2-UI and 4-UI. The transition margin ($t_m$) can be expressed as 2-UI$\leq t_m$<4-UI.

Reducing Data Latency

In order to reduce overall data latency, the double-buffered deserializer data interface as described may be used in combination with a system that aligns the associated system clock to the slowest lane of data in a multilane system. The clock alignment system, which can also be implemented independently of the double-buffered data interface, reduces data latency that may be caused by a SerDes data interface. In some embodiments, the clock alignment system aligns the system clock to the slowest SerDes lane by shifting the system clock by n-UI at a time, until the SerDes lane in which data arrives last (relative to the other SerDes lanes) exhibits the minimum path through the SerDes after alignment. It will be appreciated that n may be a fixed number or a selectable number.

After each adjustment of the system clock, an initialization routine is executed to re-align each SerDes lane before verifying the effect of the clock shift. This process is repeated until the internal system clock is aligned with the SerDes lane having the slowest data arrival time. This process is applicable to synchronous systems that generate the device or system clock based on the clock that is used in the SerDes block.

Figure 3:
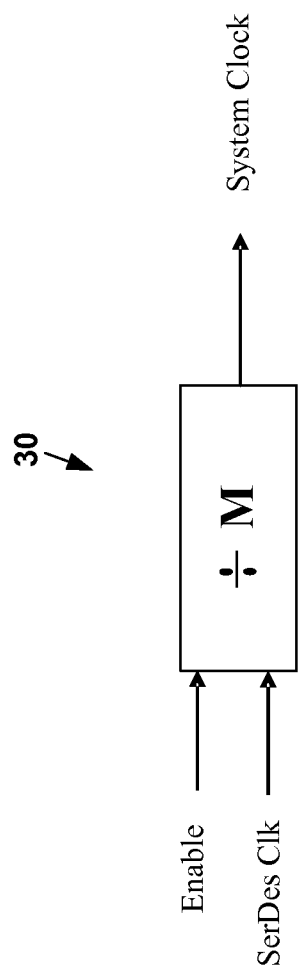
FIG. 3 depicts a counter circuit for adjusting timing of a system clock.

"Shifting" the system clock to align with the data arriving on the slowest SerDes lane is achieved by controlling the timing of the Enable signal. As shown in FIG. 3, a divider circuit 30 allows the receiving device to use the Enable signal and force a "skip" or pause in the circuit that generates the system clock. Using the divider circuit 30, a designer defines the ratio of the input clock signal (which in this example is the SerDes clock) to the clock signal used by the system. Using the Enable signal, the system clock signal is aligned with the latest-arriving data by controlling the time that the Enable signal allows for the initiation of the divider circuit 30. For example, if the SerDes clock speed is a five gigahertz (based on a ten gigahertz SerDes interface), and the value of M is five, then the system clock speed at the output of the divider circuit 30 is one gigahertz (5/5 gigahertz). This alignment system can be implemented to reduce device latency in virtually any synchronous system by insuring that data from the receiving bus is utilized as soon as it arrives at the device. No time is wasted in waiting for a clock alignment to be recognized before the data is used at the receiving device.

In this example, the system clock speed is one-tenth the SerDes clock speed (d10_clk). The importance of this relationship is exemplified in the ability of the circuit that generates the SerDes clock to also be capable of controlling the system clock. This allows the additional control of the clocking to be developed as part of the physical media dependent physical coding sublayer functions of the SerDes interface.

The clock alignment described herein works on any interface that aligns data on bit boundaries. The exemplary system described herein applies to a 10-UI SerDes link. However, it will be appreciated that the clock alignment system is applicable to any interface across a SerDes link.

The circuits depicted in FIGS. 4A-4E illustrate embodiments of logic to generate the control signals, including the enable signal (EN[4:0]), the write upper signal (Wr_Upper), the select upper signal (S1_Upper), the skip one enable signal (SK_ONE), and the sync reset signal (SD_RST).

In one embodiment, a request to offset the system clock by 2-UI is detected in the SerDes interface and is used to disable the shifting of the enable register for one SerDes clock cycle, thereby maintaining the timing relationship between the two domains.

As shown in the example of FIG. 5, the ten bits of data from the SerDes deserializer 10 are word-aligned and de-skewed to achieve frame alignment. Since the order of the received data in this example is least significant bit first, some part of the word that makes up the least significant bits of the aligned word may appear in a prior cycle. For ten-bit word alignment, the lower order bits from the prior cycle are merged with the higher order bits from the current cycle. Conceptually, this may be done with a right shifter 40 for the prior word and a left shifter 42 for the current word. An OR gate 44 performs the merge. The aligned word may be inverted by an inverter 46 to allow for the differential inputs to the SerDes lane to be swapped. In the example of FIG. 5, four stages of elastic buffer 48 provide for up to 40-UI of additional inter-lane skew. However, the amount of inter-lane skew can be adjusted by adding or deleting register stages. In a preferred embodiment, a per-lane PCS state machine and a global PCS state machine together control sequencing to achieve synchronization on all lanes, adjust the clock phase, and provide alignment until lane alignment is achieved with reduced latency for the slowest lane.

In one embodiment, the following are steps are performed in a low-latency link initialization procedure to align the slowest SerDes data lane with the receiver system clock:

(a) Acquire synchronization on all data lanes using a double buffer interface such as depicted in FIG. 1.
(b) Determine the data lane having the slowest link or latest arriving data.
(c) Determine the time difference between the system clock and the data slowest data lane.
(d) If the time difference is more than a desired unit interval differential, modify the timing of the system clock by adjusting the base clock that the phase lock loop uses to generate the system clock by a desired number of unit intervals.
(e) Repeat steps (a)-(d) until the slowest data lane is closely aligned with the device system clock.

This procedure increases the efficiency of the receiving device in utilizing the time on the receiving device, which in turn allows for reduced latency through the device.

Figure 6B:
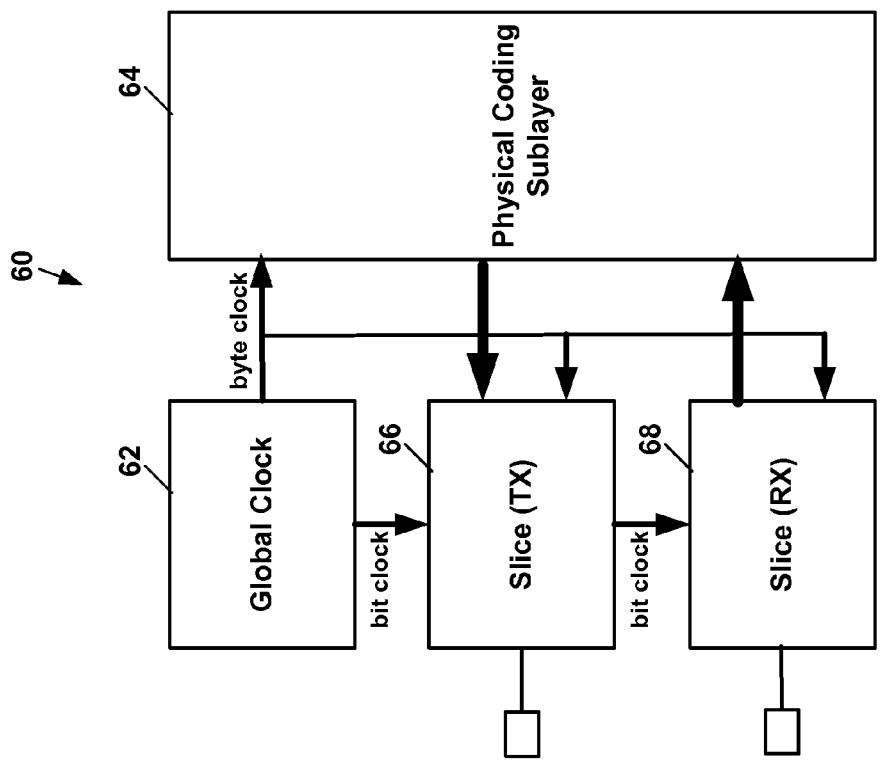
FIG. 6B depicts a clocking scheme for reducing system latency in a physical medium attachment and physical coding sublayer data interface.

In some embodiments, the clocking circuit 60 depicted in FIG. 6B is implemented to further reduce system latency. The global byte clock 62 drives out ten bits of data to the physical coding sublayer 64, data transmitter 66, and the data receiver 68. Preferably, the byte clock is a divided version of the bit clock and includes cycle slip control. The physical medium attachment is responsible for deserialization of the incoming ten-bit code groups from the physical coding sublayer 64. The purpose of the physical coding sublayer 64 is to verify that the physical medium attachment is correctly aligning data from the received serial stream.

Figure 6A:
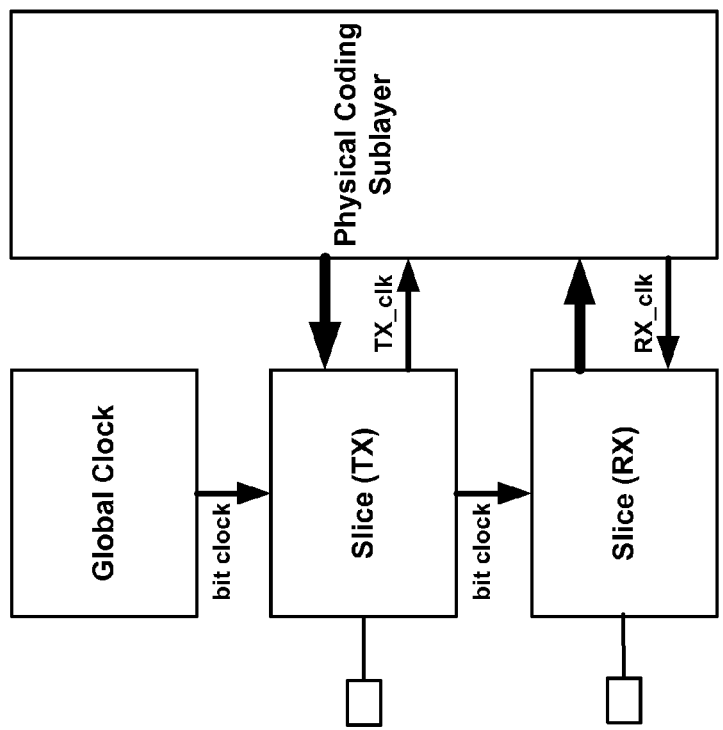
FIG. 6A depicts a conventional clocking scheme for a data interface between a physical medium attachment and a physical coding sublayer.

A conventional clocking scheme is shown in FIG. 6A, in which a global clock is provided to the physical coding sublayer 64. In this scheme, data is serialized and the physical coding sublayer 64 provides a separate clocking signal to the data transmitter and the data receiver. Data returns in serialized form to the physical coding sublayer 64.

Alternate Timing System for High-Speed Data Interface

Figure 7:
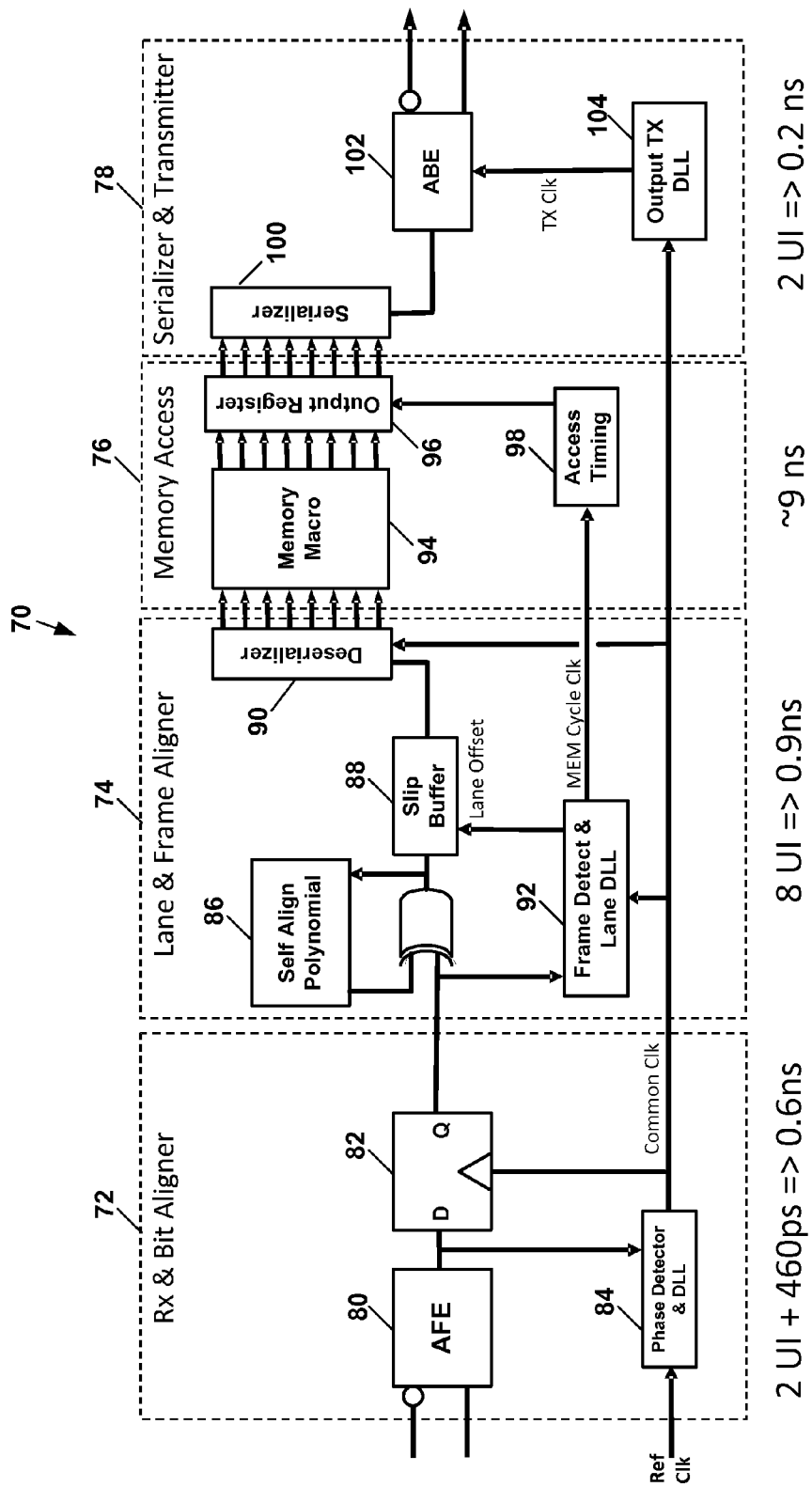
FIG. 7 depicts a schematic diagram of a high-speed data interface.

FIG. 7 depicts a high-speed data interface 70 according to an alternate embodiment. The interface 70 includes a data receiver and bit aligner 72, a lane and frame aligner 74, memory 76, and a serializer and transmitter 78.

The depicted embodiment of the receiver 72 includes an analog front end 80, a phase detector and delay locked loop 84, and a flip-flop 82. In some embodiments, a phase-locked loop is used instead of a delay locked loop, when there is a need to multiply a lower rate reference clock to match the bit rate of the incoming data. A reference clock (Ref Clk) is provided to the phase detector 84. The output of the phase detector 84 (referred to herein as the common clock) is adjusted to match the timing of the incoming data to the analog front end 80. The common clock provides the internal timing for the entire interface 70. For example, in the frame aligner 74, the common clock provides clocking to enable the slip buffer 88 to align bits across multiple lanes. The cumulative word may then be aligned with the internal core clock of the memory 76. Although other methods could be used to determine and adjust data offset, such as dynamic CDR, the use of training patterns is the preferred method. Data is provided to the analog front end 80, which is sampled by the flip-flop 82 and converted to digital data. In some embodiments, each bit lane has a one-bit asynchronous phase alignment.

In the memory 76, a delayed version of the common clock (referred to in FIG. 7 as the MEM Cycle Clk) from the frame detect and lane delay lock loop 92 is provided to the access timing circuit 98 of the memory 76, where it is used to clock data out into the output register 96, thereby allowing the memory 76 to be accessed and data to be synchronized. The common clock is also provided to the output transmitter delay lock loop 104, which generates the transmit clock in the serializer and transmitter 78. The transmit clock (referred to in FIG. 7 as the TX Clk) is used in serializing data in the serializer 100, which data is output through the analog back end 102.

Thus, the entire interface 70 is synchronized based on the common clock signal. This eliminates the need for asynchronous FIFO buffers in the memory path, thereby reducing latency in the memory 76. This also eliminates the need to extract any clocking information from the receiver 72, since clocking is provided on a separate input.

Figure 8:
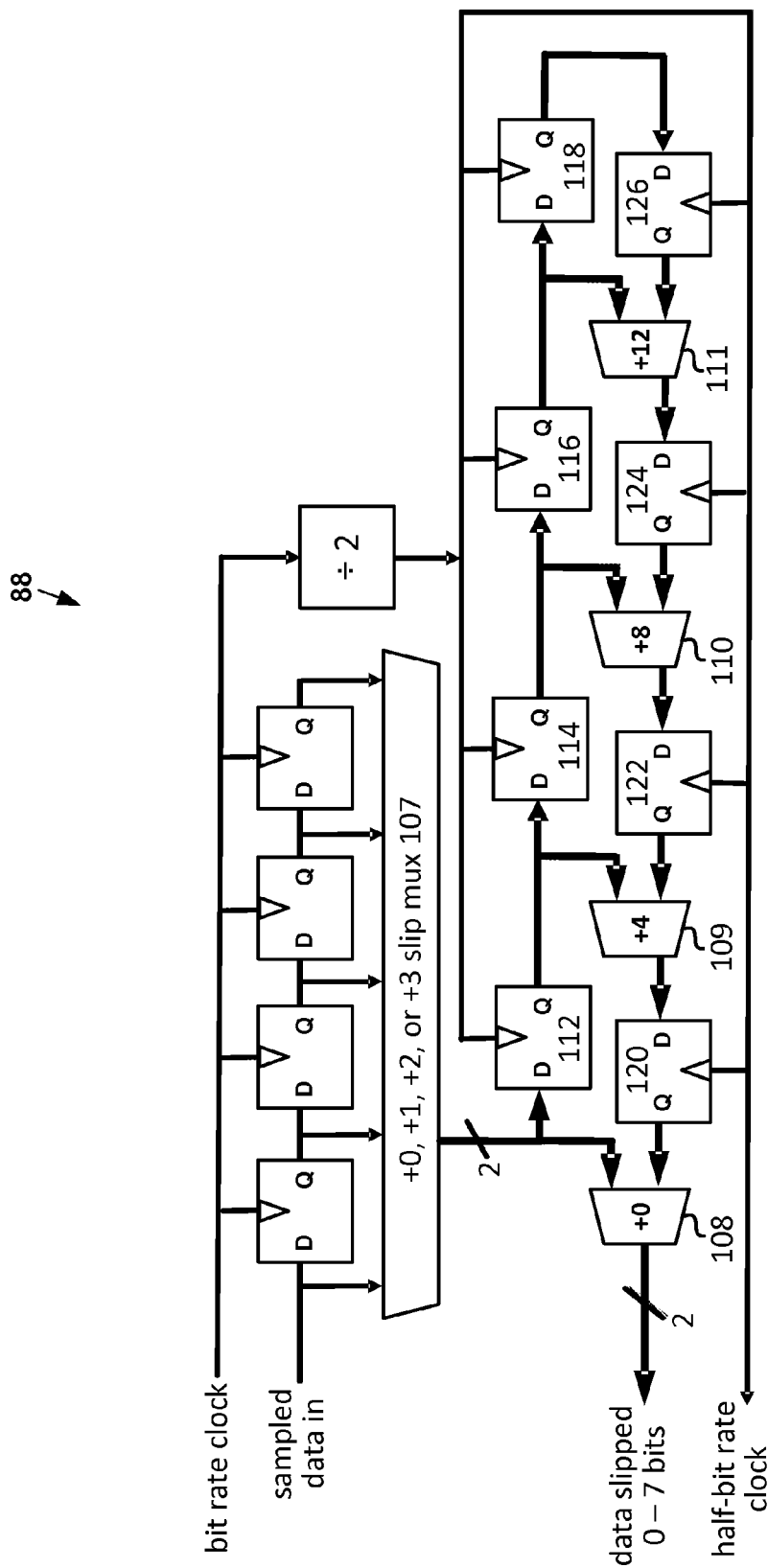
FIG. 8 depicts a schematic diagram of a slip buffer of a high-speed data interface.

Shown in FIG. 8 is an embodiment of the slip buffer 88 of FIG. 7, which achieves lane alignment on 10-UI with reduced latency. This contrasts with the double buffer 12 of FIG. 1, which achieves alignment on a nominally true zero-bit delay. The bit lanes are then aligned on their respective character boundaries.

One of the limitations of how fast the slip buffer of FIG. 8 can be operated is determined by the physical layout and circuit loading. In the embodiment of FIG. 8, the sampled data is fed into a shift register from which two bits are selected. For example, a slip of zero, one, two, or three can be accomplished by controlling the selection of the two bits using the so-called slip mux 107. The two bits are then fed to shift register 112 (or directly out through mux 108, if it is enabled), which clocks two bits at a time on the divided-down bit rate clock. The shift register chain can be programmed to be any length by selectively enabling one of the muxes 108, 109, 110, or 111 to bypass one or more of the registers in the shift register chain.

If mux 109 is enabled, the two bits shift out of register 112 through mux 109 and into register 120. If mux 111 is enabled, the two bits would shift through 112, 114, and 116 into mux 111 to be shifted out of register 124, thereby bypassing registers 118 and 126. Alternate delay paths are also possible depending on which one of multiplexers 109, 110 or 111 is enabled.

Consequently, the overall delay through the slip buffer shown in FIG. 8 is set by programming mux 107 and enabling one of the muxes 108, 109, 110, or 111. One advantage of this structure is the "loop back" layout of the shift register chain, where the path from any two bit flip flop to the next flip flop is the same minimal length and only includes one multiplexor.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for reducing data latency during deserialization of one or more lanes of serial data, the method comprising:
    (a) providing a double buffer having an upper buffer half and a lower buffer half,
    (b) sequentially writing pairs of deserialized bits of the serial data to the upper buffer half at a first clock speed of a first clock signal,
    (c) when the upper buffer half is full, reading all data from the upper buffer half in parallel into a physical coding sublayer at a second clock speed of a system clock signal, wherein the second clock speed is less than and dependent on the first clock speed,
    (d) sequentially writing pairs of deserialized bits of the serial data to the lower buffer half at the first clock speed,
    (e) when the lower buffer half is full, reading all data from the lower buffer half in parallel into the physical coding sublayer at the second clock speed, and
    (f) aligning the data from the upper buffer half and the lower buffer half in the physical coding sublayer.

2. The method of claim 1 further comprising, prior to step (b), registering a first bit of the serial data on a leading clock edge of the first clock signal, and registering a second bit of the serial data on a trailing clock edge of the first clock signal, thereby forming a pair of deserialized bits.

3. The method of claim 1 wherein the upper buffer half and the lower buffer half each comprise ten registers configured in pairs.

4. The method of claim 1 further comprising the step of performing training to synchronize the writing of the pairs of deserialized bits of the serial data at the first clock speed and the reading of the data from the upper and lower buffer halves at the second clock speed.

5. The method of claim 1 wherein the system clock signal is a divided version of the first clock signal.

6. The method of claim 5, further comprising aligning the system clock signal to a slowest lane of the multilane serial data.

7. The method of claim 1, further comprising:
    activating a system reset signal to initialize the double buffer;
    registering the system reset signal in response to the system clock signal, thereby providing a first registered system reset signal; and then registering the first registered system reset signal in response to the first clock signal, thereby providing a second registered system reset signal.

8. The method of claim 7, wherein the steps of reading data from the upper buffer half and reading data from the lower buffer half are initialized in response to activating the system reset signal.

9. The method of claim 8, wherein the steps of writing pairs of deserialized bits of the serial data to the upper buffer half and the lower buffer half are initialized by the second registered system reset signal.

10. The method of claim 7, further comprising:
writing pairs of deserialized bits of the serial data to a same register of the upper buffer half or the lower buffer half for two consecutive cycles of the first clock signal; and then
cyclically writing pairs of deserialized bits of the serial data to a plurality of registers of the upper buffer half and the lower buffer half for subsequent cycles of the first clock signal.

11. The method of claim 1, further comprising:
generating a first set of enable signals, wherein each of the enable signals of the first set enables a write operation to a corresponding register in the upper buffer half; and
controlling the first set of enable signals to enable sequential write operations to the same register in the upper buffer half.

12. The method of claim 11, further comprising:
generating a second set of enable signals, wherein each of the enable signals of the second set enables a write operation to a corresponding register in the lower buffer half; and
controlling the second set of enable signals to enable sequential write operations to the same register in the lower buffer half.

13. The method of claim 11, further comprising selecting either the upper buffer half or the lower buffer half to be read in response to the system clock signal, independent of the first set of enable signals.

14. The method of claim 1, wherein the system clock signal has no reliance upon the first clock signal.

15. The method of claim 1 further comprising repeating steps (b) through (f) until all the serial data has been buffered and aligned.

16. A data interface for reducing data latency during deserialization of one or more lanes of serial data, the data interface comprising:
a first clock for generating a first clock signal having a first clock speed,
a second clock for generating a second clock signal having a second clock speed that is less than and dependent on the first clock speed, and
a double buffer having:
an upper buffer half into which pairs of deserialized bits of the serial data are sequentially written at the first clock speed, and from which all stored data is read in parallel into a physical coding sublayer at the second clock speed when the upper buffer half is full, and
a lower buffer half into which pairs of deserialized bits of the serial data are sequentially written at the first clock speed, and from which all stored data is read in parallel into the physical coding sublayer at the second clock speed when the lower buffer half is full,
wherein the data from the upper buffer half and the lower buffer half are aligned in the physical coding sublayer.

17. The data interface of claim 16 wherein the upper buffer half and the lower buffer half each comprise ten registers configured in pairs.

18. The data interface of claim 16 wherein the first clock signal is a divided version of a system clock signal which is aligned to a slowest lane of the one or more lanes of serial data.

19. A data interface for reducing data latency during deserialization of one or more lanes of serial data, the data interface comprising:
means for deserializing bits of the serial data, and providing the deserialized bits at a first clock speed in response to a first clock signal;
a double buffer having an upper buffer half and a lower buffer half;
means for sequentially writing a first set of the deserialized bits to the upper buffer half at the first clock speed;
means for sequentially writing a second set of the deserialized bits to lower buffer half at the first clock speed;
means for reading the first set of the deserialized bits from the upper buffer half in parallel into a physical coding sublayer at a second clock speed of a system clock signal when the upper buffer half is full, wherein the second clock speed is less than and dependent on the first clock speed;
means for reading the second set of the deserialized bits from the lower buffer half in parallel into the physical coding sublayer at the second clock speed when the lower buffer half is full; and
means for aligning the first and second sets of deserialized bits in the physical coding sublayer.

20. The data interface of claim 19 wherein the first clock signal is a divided version of the system clock signal.

* * * * *